US006654296B2

(12) United States Patent
Jang et al.

(10) Patent No.: US 6,654,296 B2
(45) Date of Patent: Nov. 25, 2003

(54) DEVICES, CIRCUITS AND METHODS FOR DUAL VOLTAGE GENERATION USING SINGLE CHARGE PUMP

(75) Inventors: Seong-jin Jang, Kyungki-do (KR); Young-hyun Jun, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/096,345

(22) Filed: Mar. 12, 2002

(65) Prior Publication Data
US 2003/0016565 A1 Jan. 23, 2003

Related U.S. Application Data
(60) Provisional application No. 60/307,213, filed on Jul. 23, 2001.

(51) Int. Cl.[7] ............................................... G11C 16/04
(52) U.S. Cl. ............................... 365/189.09; 365/230.6; 365/226; 327/536; 327/154
(58) Field of Search ....................... 365/189.06, 230.06; 327/536, 154

(56) References Cited
U.S. PATENT DOCUMENTS

| 5,589,793 A | * 12/1996 | Kassapian | 327/536 |
| 5,726,944 A | * 3/1998 | Pelley, III et al. | 365/226 |
| 5,886,932 A | 3/1999 | Choi | 365/189.09 |
| 5,889,664 A | 3/1999 | Oh | 363/60 |
| 6,166,982 A | * 12/2000 | Murray et al. | 365/226 |
| 6,429,732 B1 | * 8/2002 | Tedrow et al. | 327/548 |

* cited by examiner

Primary Examiner—Michael S. Lebentritt
Assistant Examiner—Pho Luu
(74) Attorney, Agent, or Firm—Marger Johnson & McCollom, P.C.

(57) ABSTRACT

Devices, circuits and methods for dual voltage generation using a single charge pump. The dual voltages can be the same or different, as they are for two different components of a device. An oscillator generates an oscillating signal, and a charge pump generates a pumping voltage at a pumping node responsive to the oscillating signal. A first switching circuit is coupled to the pumping node, and outputs from the pumping voltage a first voltage to the first component. A second switching circuit is coupled to the pumping node, and outputs from the pumping voltage a second voltage to the second component. The first and second output voltages may optionally be sensed. The oscillator may be triggered and the first and second switching circuits may be controlled as needed to maintain the sensed first and second voltages at desired values and/or ranges.

37 Claims, 12 Drawing Sheets

US 6,654,296 B2

DEVICES, CIRCUITS AND METHODS FOR DUAL VOLTAGE GENERATION USING SINGLE CHARGE PUMP

CROSS REFERENCE TO RELATED APPLICATIONS

This application claims priority from U.S.A. Provisional Application No. 60/307,213, filed on Jul. 23, 2001, the disclosure of which is hereby incorporated by reference for all purposes.

BACKGROUND OF THE INVENTION

1. Field of the Invention

The present invention is related to the field of generating individualized voltages in semiconductor memory devices, and more specifically to devices, circuits and methods for generating dual voltages with a single charge pump in such devices.

2. Description of the Related Art

Semiconductor memory devices store data in memory cells, and use wordlines for addressing these cells. It is often advantageous to apply voltages to these components. For example, a backbiasing voltage applied to a p-well that surrounds a memory cell prevents erasure of the data stored in that cell. Indeed, such a voltage helps maintain a pn junction at a reverse biased state.

This problem was addressed in the prior art by using a single voltage generator for diverse needs. This, however, introduced pumping inefficiencies, since the applied voltages were best applied at different optimum values. The generated voltage was generally different than the individual optimum values.

Another solution was to include many voltage generators, one for each one of the required values. The problem, however, with that practice is that these voltage generators require a large area in the chip.

Referring now to FIG. 1, a prior art device 100 is shown as taught in U.S. Pat. No. 5,886,932. As will be appreciated, progress was made both in conserving space and in pumping efficiency, but only for generating different voltages, but only at different times.

Device 100 includes a VBB generator 110 that outputs a single back bias voltage. The output voltage can assume only one of two values, namely VBB1 and VBB2, in two separate situations. In the first situation, a normal refresh mode is indicated, by using control signal NORM to activate a switch N1. In the second situation, a self refresh mode is indicated by using control signal SREF to activate a switch N2. In each case, an enable signal (ENABLE-N or ENABLE-S) is transmitted to VBB generator 110. In turn, the latter returns the output to a level detector (Level Detector#1 120 or Level Detector#2 130), for comparing with a respective reference voltage level, and controlling accordingly. This way the output voltage assumes the value of one of the reference voltage levels, as controlled by enable signals ENABLE-N or ENABLE-S.

Device 100 works where there is no requirement for simultaneous generation of different voltages. But it does not work where different voltages must be output concurrently.

Referring now to FIG. 2, another prior art device 200 is shown, which is taught in U.S. Pat. No. 5,889,664. As will be appreciated, progress was made in producing two voltages concurrently, and saving some space over the prior usual practice.

In device 200, a single oscillator 210 is shared, which decreases the requirement for space. But there are two charge pumping circuits 220, 230, which still require a lot of area from device 200. Circuits 220, 230 receive signals S212, S213 from oscillator 210, and respectively generate voltages VBB, VPP. Voltage VBB is negative, while voltage VPP is positive, having higher voltage than supply voltage. Voltages VBB, VPP are sensed in detectors 240, 250 respectively. These produce detection signals S242, S252 for oscillator 210, and detection signals S246, S256 for a control logic unit 260.

Referring now to FIG. 3, yet another prior art device 300 is shown. Device 300 makes additional progress in the prior art, but wastes electrical current.

Device 300 includes a single VBB2 generator 310, which may be made by a charge pump and a capacitor. Generator 310 generates a voltage VBB2 at a node 320, which is applied to a substrate of memory cell transistors 330 of a memory device in order to back bias it. In addition, a voltage VBB1 is derived from node 320 by using a transistor 340 and a differential amplifier 350. Amplifier 350 has a negative input at a reference value of the desired other voltage, namely VBB1. This produces a voltage VBB1 that is applied to wordline driver circuits 360 of a memory device. Given the connections, voltage VBB1 is higher than VBB2.

The problems with device 300 are associated with the generation of VBB1 from node 320. While differential amplifier 350 attempts to maintain the output at the desired level, it consumes a lot of electrical current. That is because transistor 340 drains current from node 370. Accordingly, there is a decreased pumping efficiency, because of producing more VBB2 voltage having low efficiency for maintaining the desired VBB1 voltage level.

As semiconductor memory devices become smaller, it is required of them to have less area for components such as voltage generators. As they are to operate with less power, higher pumping efficiencies are needed.

BRIEF SUMMARY OF THE INVENTION

The present invention overcomes these problems and limitations of the prior art.

Generally, the present invention provides devices, circuits and methods for dual voltage generation using a single charge pump. The dual voltages can be the same or different, as they are for two different components of a device. These components may be a wordline driver circuit, a bit line sense amplifier block control circuit, a substrate of a memory cell transistor, etc.

An oscillator generates an oscillating signal, and a charge pump generates a pumping voltage responsive to the oscillating signal. A first switching circuit outputs from the pumping voltage a first voltage to the first component. A second switching circuit outputs from the pumping voltage a second voltage to the second component.

The switching circuits are optionally and preferably adjusted to deliver the first and second voltages at exactly the optimum values. This optimizes efficiency, and prevents waste in electrical current.

In addition, a single charge pump is used. This offers the advantage that space is conserved.

These and other features and advantages of the invention will become more readily apparent from the following Detailed Description, which proceeds with reference to the drawings, in which:

BRIEF DESCRIPTION OF THE DRAWINGS

FIG. 6 is enabled.

FIG. 6 is enabled.

DETAILED DESCRIPTION OF THE PREFERRED EMBODIMENT(S)

As has been mentioned, the present invention provides devices, circuits and methods for dual voltage generation using a single charge pump. The invention is now described in more detail.

Figure 1:
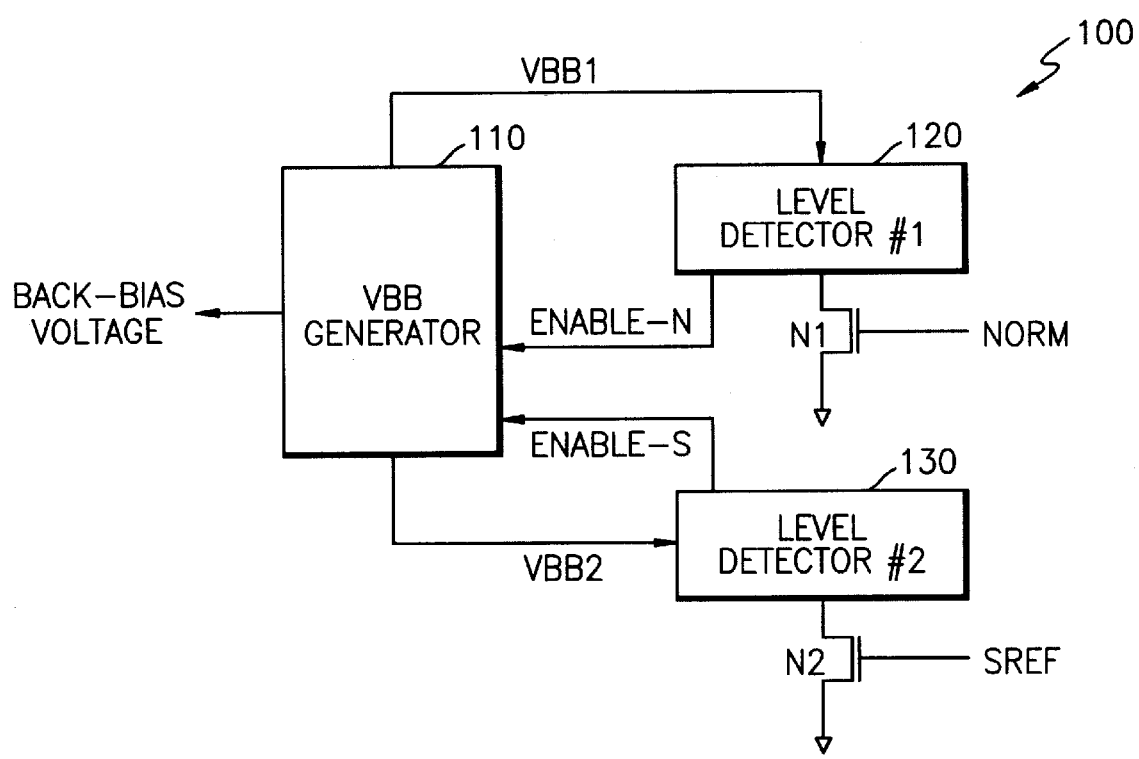
FIG. 1 is a block diagram of a first device in the prior art.
Figure 2:
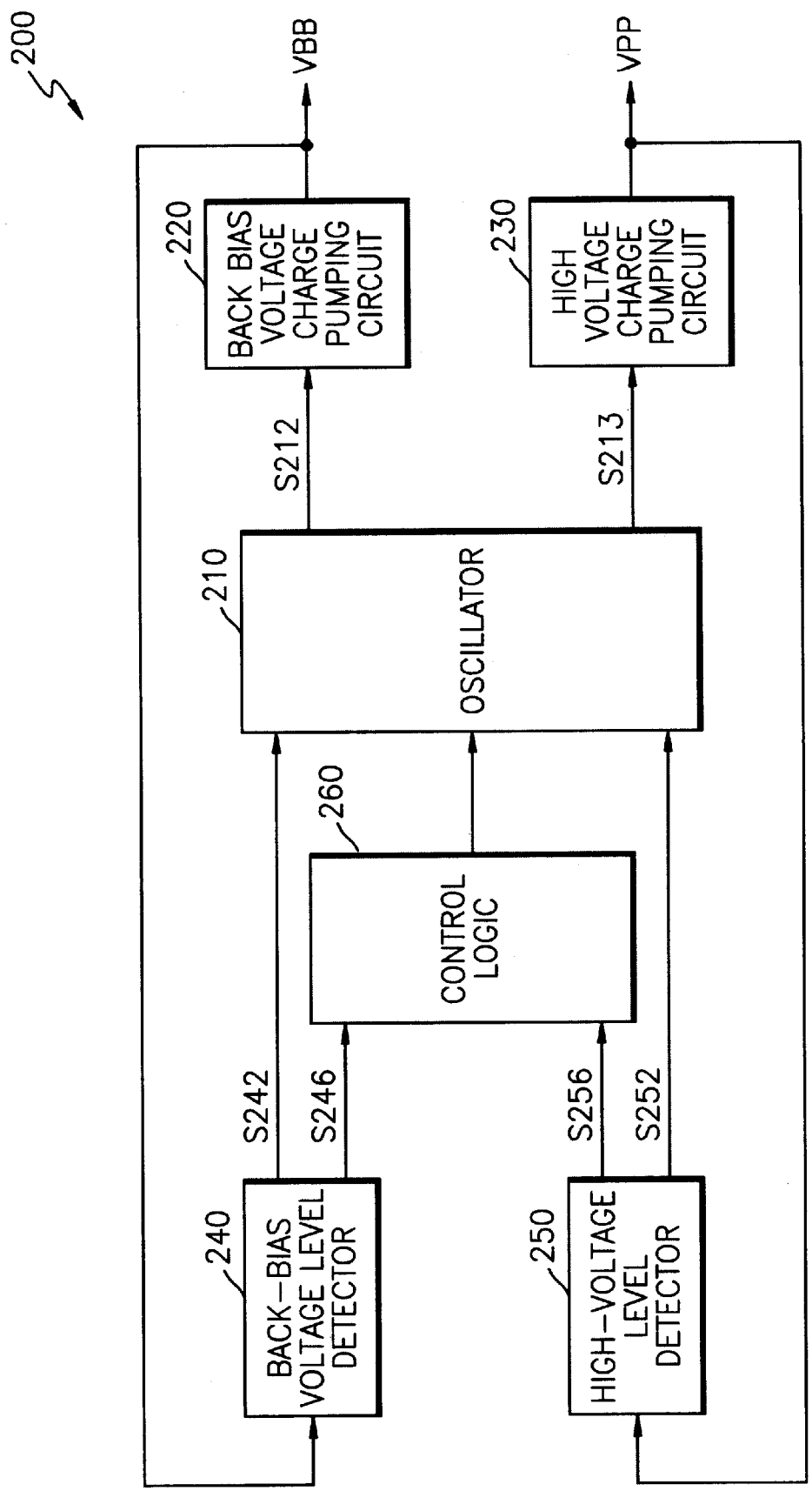
FIG. 2 is a block diagram of a second device in the prior art.
Figure 3:
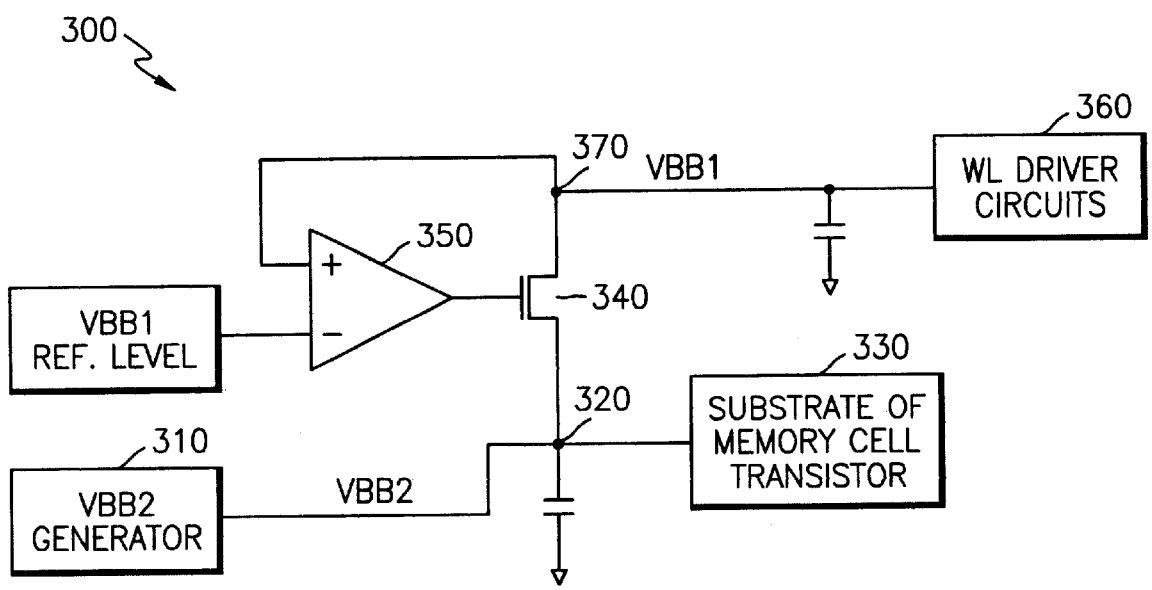
FIG. 3 is a block diagram of a third device in the prior art.
Figure 4:
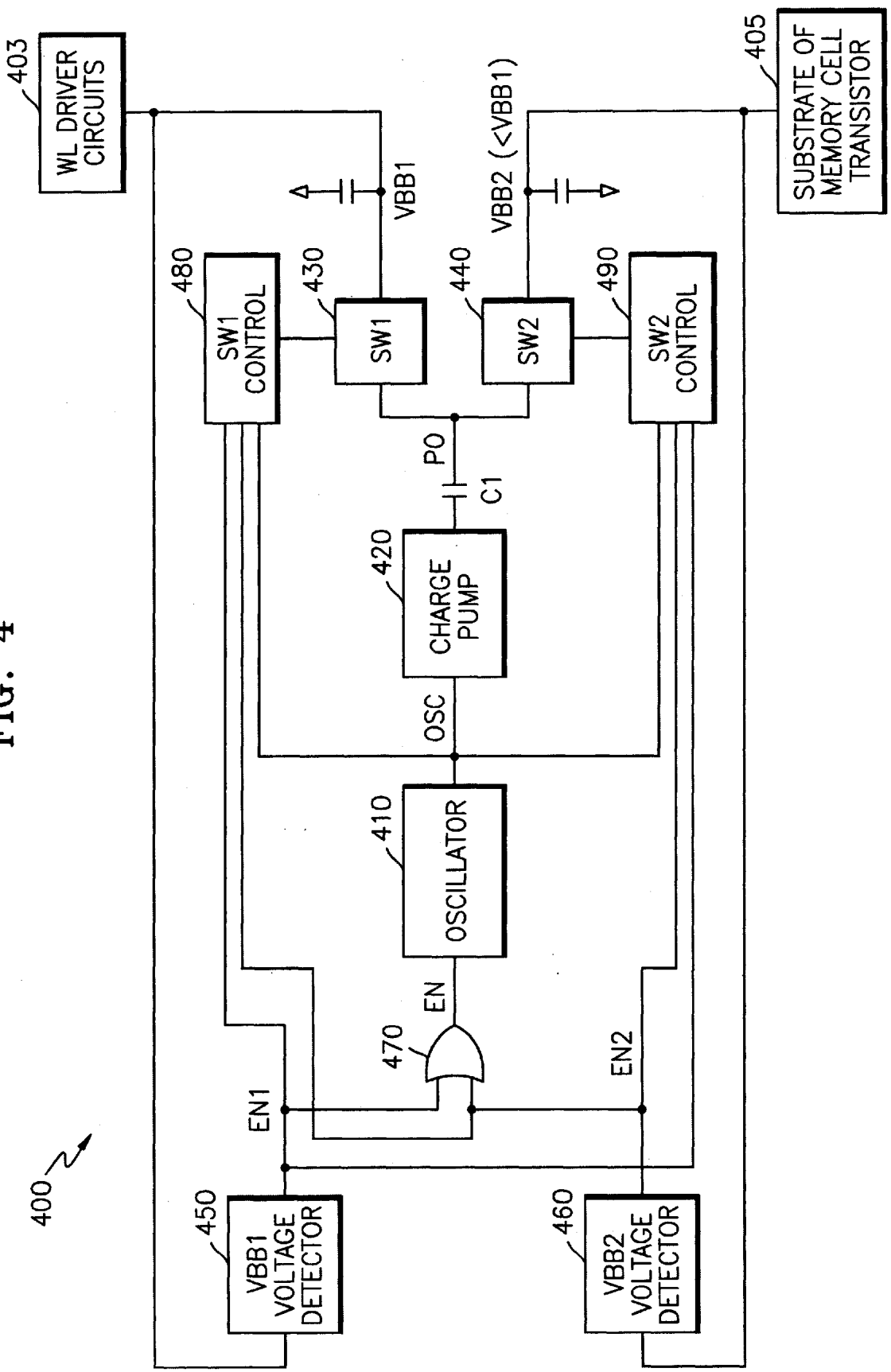
FIG. 4 is a block diagram of a device made according to an embodiment of the present invention.

Referring now to FIG. 4, a first embodiment of the invention is described. Outputs of a semiconductor memory device 400 respectively are applied to a wordline driver circuit 403 and to a substrate of a memory cell transistor 405.

Device 400 includes an oscillator 410. Oscillator 410 generates an oscillating signal OSC. Oscillator 410 is controlled by a signal EN as will be described below.

Device 400 moreover includes a charge pump 420, which receives oscillating signal OSC. Charge pump 420 generates a pumping voltage at a pumping node PO. As is preferred, charge pump 420 includes a pumping capacitor C1. Equivalently, pumping capacitor C1 may be considered a separate element from charge pump 420. In either case, it is preferred that pumping capacitor C1 has a terminal at pumping node PO.

Device 400 further includes a first switching circuit SW1 430. Circuit SW1 430 is coupled to pumping node PO, from where it receives the pumping voltage. Circuit SW1 430 outputs a first voltage VBB1 to circuit 403.

Device 400 additionally includes a second switching circuit SW2 440. Circuit SW2 440 is coupled to pumping node PO, from where it receives the pumping voltage. Circuit SW2 440 outputs a second voltage VBB2 to circuit 405.

In the embodiment of device 400, VBB2 is lower than VBB1, although that is not necessary for practicing the invention. In addition, both voltages may be negative, although again that is not necessary for practicing the invention.

Device 400 further includes a first control unit 480. Unit 480 controls the first switching circuit SW1 430 responsive to oscillating signal OSC.

Device 400 also includes a second control unit 490. Unit 490 controls the second switching circuit SW2 440 responsive to oscillating signal OSC.

Device 400 additionally includes a first voltage detector 450. Detector 450 outputs a first detection signal EN1 in response to the generated first voltage VBB1. First detection signal EN1 is preferably received by both control units 480, 490.

Device 400 also includes a second voltage detector 460. Detector 460 outputs a second detection signal EN2 in response to the generated second voltage VBB2. Second detection signal EN2 is preferably received by both control units 480, 490.

Device 400 moreover includes an oscillator control circuit 470. Circuit 470 is for selectively controlling oscillator 410, responsive to first detection signal EN1 and second detection signal EN2. In the embodiment of FIG. 4, circuit 470 is implemented by an OR gate, and outputs a signal EN.

Figure 5:
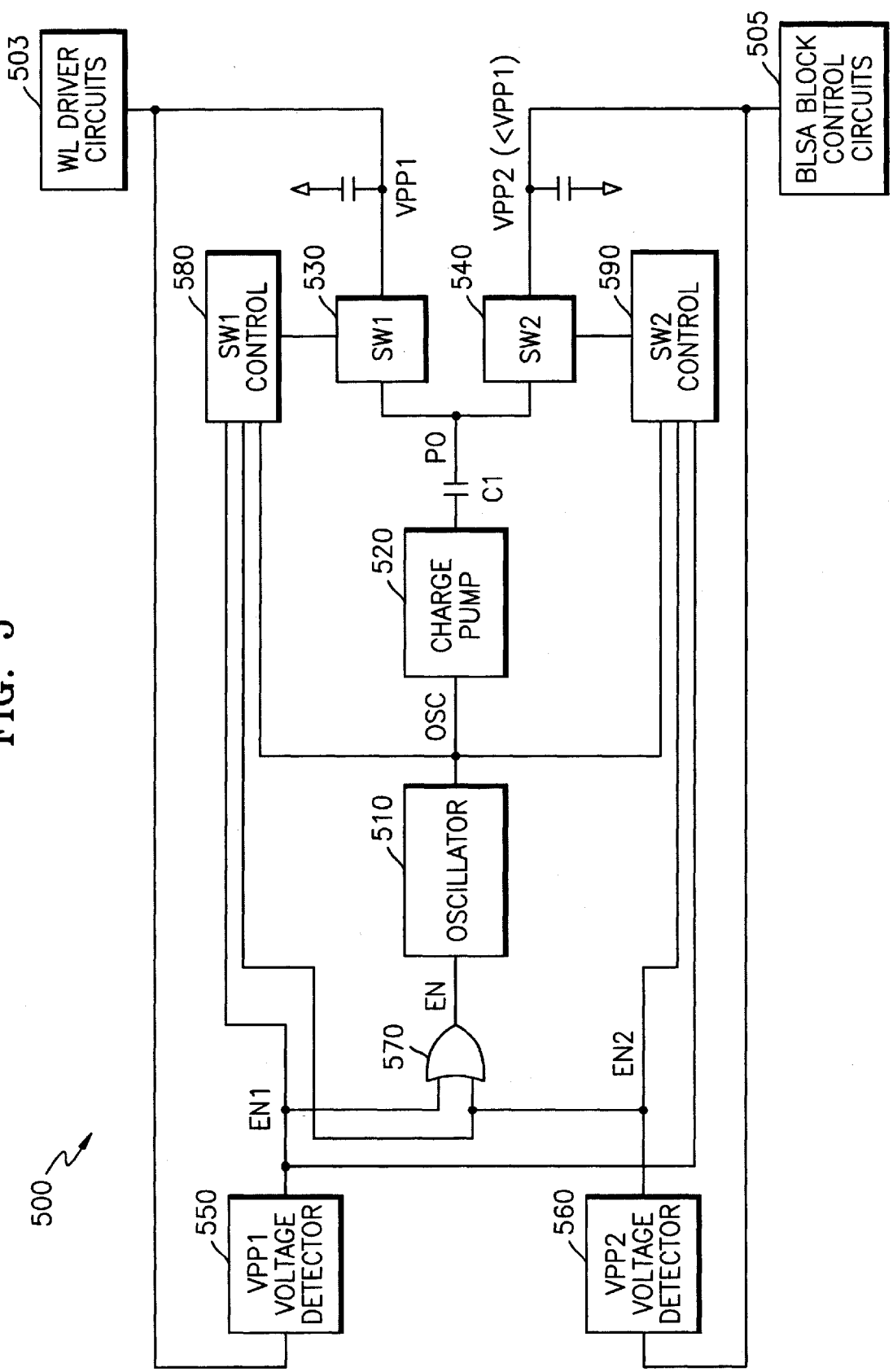
FIG. 5 is a block diagram of a device made according to another embodiment of the present invention.

Referring now to FIG. 5, a device 500 made according to another embodiment of the invention is described. Outputs of the device 500 are respectively applied to a wordline driver circuit 503 and to a bit line sense amplifier block control circuit 505.

Device 500 includes an oscillator 510 (similar to oscillator 410), and a charge pump 520 (similar to charge pump 420), which pumps through a pumping capacitor C1 to a pumping node PO.

Device 500 further includes a first switching circuit SW1 530 (similar to SW1 430) that receives the pumping voltage and outputs a first voltage VPP1 to circuit 503.

Device 500 moreover includes a second switching circuit SW2 540 (similar to SW2 440) that receives the pumping voltage and outputs a second voltage VPP2 to circuit 505.

Device 500 also includes a first control unit 580 (similar to first control unit 480), a second control unit 590 (similar to second control unit 490), a first voltage detector 550 (similar to first voltage detector 450), a second voltage detector 560 (similar to second voltage detector 460), and an oscillator control circuit 570 (similar to oscillator control circuit 470).

In the embodiment of device 500, VPP1 may be higher than a supply voltage, although that is not necessary for practicing the invention. In addition, VPP2 is lower than VPP1, although again that is not necessary for practicing the invention.

Figure 6:
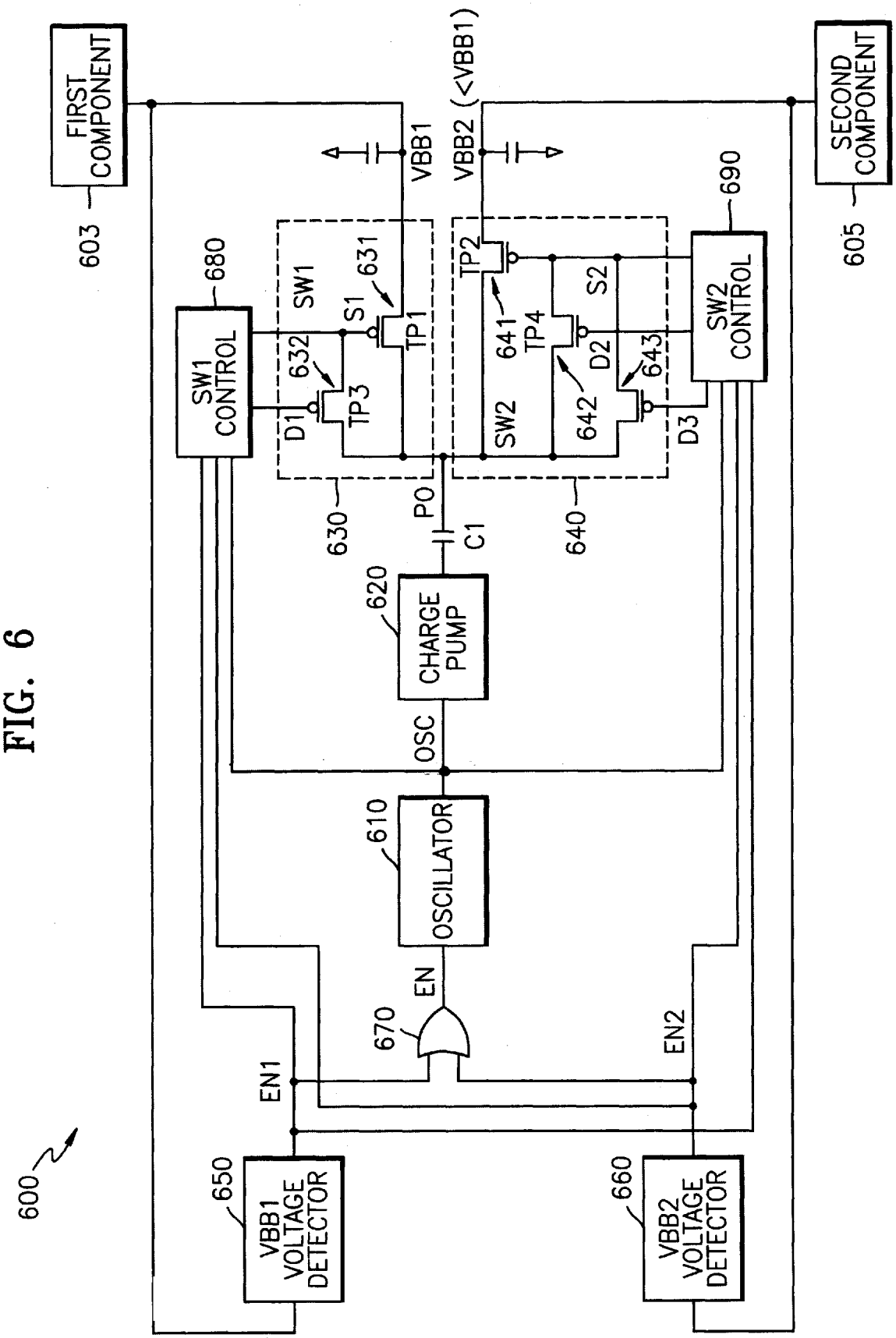
FIG. 6 is a block diagram of a device made according to another embodiment of the present invention.

Referring now to FIG. 6, a circuit 600 made according to another embodiment of the invention is described. It will be appreciated that the drawing of FIG. 6 has many similarities with those of FIG. 4 and FIG. 5.

Device 600 includes a first component 603 and a second component 605. First component 603 and second component 605 may be any components of a memory device. For example, component 603 may be a wordline driver circuit. Further, component 605 may be a substrate of a memory cell transistor.

Device 600 additionally includes an oscillator 610 (similar to oscillator 410), and a charge pump 620 (similar to charge pump 620), which pumps through a pumping capacitor C1 to a pumping node PO.

Device 600 further includes a first switching circuit 630 (similar to SW1 430) that receives the pumping voltage and outputs a first voltage VBB1 to first component 603.

Device 600 moreover includes a second switching circuit 640 (similar to SW2 440) that receives the pumping voltage and outputs a second voltage VBB2 to second component 605.

Device 600 also includes a first control unit 680 (similar to first control unit 480), a second control unit 690 (similar to second control unit 490), a first voltage detector 650 (similar to first voltage detector 450), a second voltage detector 660 (similar to second voltage detector 460), and an oscillator control circuit 670 (similar to oscillator control circuit 470).

In the embodiment of device 600, VBB2 is lower than VBB1, although that is not necessary for practicing the invention. In addition, VBB1 may range from negative to a ground voltage. Alternately, VBB1 may equal VBB2. For any set of these values of VBB1 and VBB2 (and VPP1, VPP2), the principles of the invention are the same.

Continuing to refer to FIG. 6, a more detailed description is given of the preferred embodiment of first switching circuit 630 and second switching circuit 640. This description may well be transferred respectively to SW1 430 and SW2 440 of FIG. 4, and also to SW1 530 and SW2 540 of FIG. 5.

First switching circuit 630 includes a first transfer transistor TP1 631. Transfer transistor TP1 631 is coupled between the pumping node PO and the first component 603. First switching circuit 630 also includes a first control transistor TP3 632 coupled between the pumping node PO and a gate S1 of first transfer transistor TP1 631. Gate S1 of first transfer transistor TP1 631 and a gate D1 of first control transistor TP3 632 receive control signals from first control unit 680, as described later in this document.

Second switching circuit 640 includes a second transfer transistor TP2 641. Transfer transistor TP2 641 is coupled between the pumping node PO and the second component 605. Second switching circuit 640 also includes a first control transistor TP4 642 coupled between the pumping node PO and a gate S2 of the second transfer transistor TP2 641. Furthermore, second switching circuit 640 also includes a second control transistor 643 coupled between the pumping node PO and gate S2 of second transfer transistor TP2 641. Gate S2 of second transfer transistor TP2 641, a gate D2 of first control transistor TP4 642, and a gate D3 of second control transistor 643 receive control signals from second control unit 690, as described later in this document.

The operation of the circuit of FIG. 6 is now described with reference to FIG. 7, FIG. 8, and FIG. 9. Some similarities will be observed.

Figure 7:
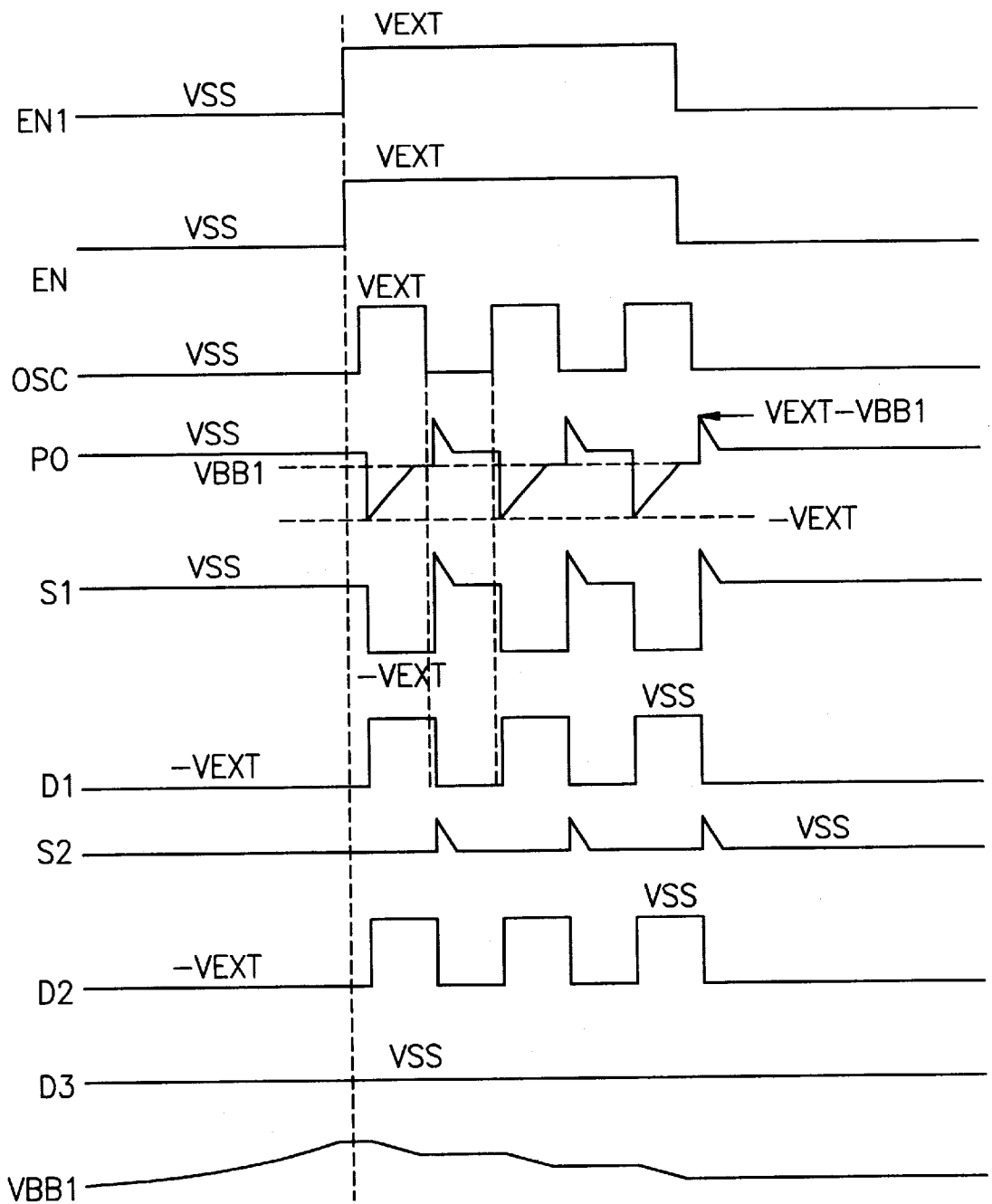
FIG. 7 is a timing diagram showing signals relative to each other when a first detector of the circuit of FIG. 4 or FIG. 5

Referring now to FIG. 7, a timing diagram is shown to describe signals relative to each other when first detector 650 of the circuit of FIG. 6 is enabled. First voltage detector 650 detects whether voltage VBB1 is within an appropriate voltage value range. If VBB1 drifts higher than the upper end, detection signal EN1 is enabled to "high". This enables output signal EN of oscillator control circuit 670 to be "high". Equivalently, the range can be merely a threshold, since the charge pump only corrects in a single direction.

Since output signal EN becomes "high", oscillator 610 and charge pump control circuit 620 become active. Negative charges are thus pumped by pumping capacitor C1 to pumping node PO, and also lower voltage of VBB1 through first switching circuit 630, until it comes back within the appropriate range. In the example of FIG. 7, that takes three cycles of the oscillating signal OSC of the oscillator 610, during which VBB1 is lowered in steps. During that time, first transfer transistor TP1 631 is adapted to be alternatingly turned on and off with a period similar to that of the oscillating signal OSC.

More particularly, at the moment the pumping node PO becomes pre-charged to the level of a ground voltage VSS, and oscillating signal OSC becomes "high", pumping node PO is taken to a voltage—VEXT. Simultaneously, the bias at gate S1 of first transfer transistor TP1 631 becomes voltage—VEXT, and thus negative charges from pumping node PO are transmitted to the voltage VBB1. At this time, the bias at gate D1 of first control transistor 632 was being maintained at the ground voltage VSS. In other words, the first transfer transistor operates with a phase opposite from that of the first control transistor. Accordingly, pumping node PO and gate S1 of first transfer transistor 631 are separated.

After the negative charges are transmitted to the voltage VBB1, oscillation signal OSC becomes "low", the voltage level at gate S1 of first transfer transistor 631 becomes the ground voltage VSS, and the voltage level at the gate D1 of first control transistor 632 becomes voltage—VEXT. Accordingly, pumping node PO and the VBB1 node are connected to a diode. As a result, the negative charges do not flow from the VBB1 node back to pumping node PO. This holds true even if the voltage at pumping node PO is increased to a positive voltage, that is, to VEXT-VBB1, by coupling. In this state, pumping node PO is pre-charged to the ground voltage VSS, and charge pumping is repeated in the next cycle of oscillation signal OSC.

At this time, a bias at gate D2 of the transistor TP4 642 also operates with first control transistor 632, thereby maintaining the voltage level of a gate S2 of transfer transistor 641 at the ground voltage VSS.

Figure 8:
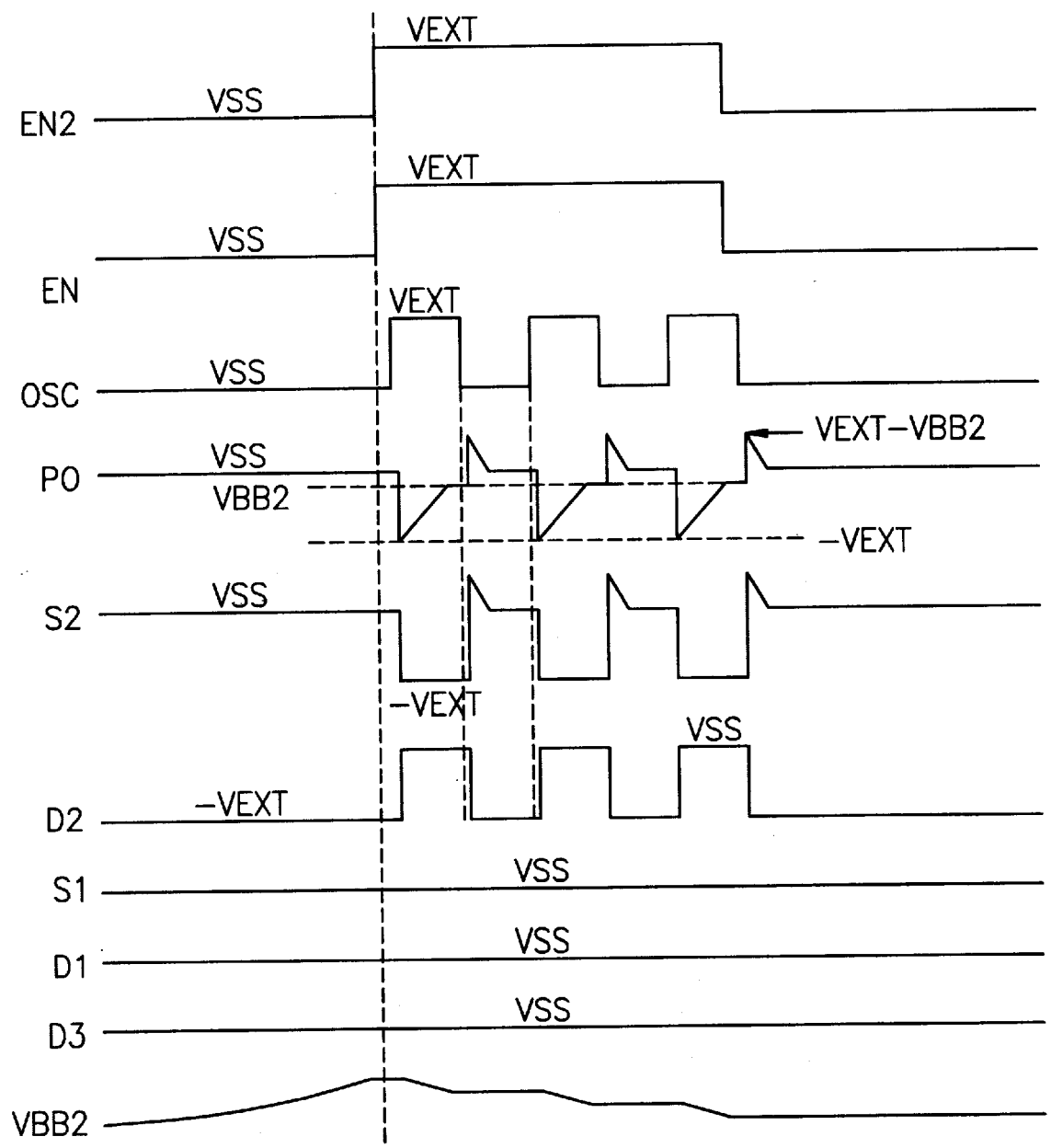
FIG. 8 is a timing diagram showing signals relative to each other when a second detector of the circuit of FIG. 4 or FIG. 5

Referring now to FIG. 8, a timing diagram is shown to describe signals relative to each other when second detector 660 of the circuit of FIG. 6 is enabled. Again, this enables output signal EN of oscillator control circuit 670 to be "high".

An operation is performed that is almost similar to that of FIG. 7. Charge pumping is performed repeatedly, until an appropriate value of the voltage VBB2 is obtained. The only differences are that the gate biases of transistors 631, 632 are continuously maintained at the ground voltage VSS. Accordingly VBB1 node and pumping node PO are separated from each other. A gate D3 of transistor 643 is maintained at the ground voltage VSS.

An observation from the circuits of FIG. 7 and FIG. 8 is that it is possible for only one of the output voltages VBB1, VBB2 to be corrected. In other words, one of the switching circuits operates while the other does not operate.

Figure 9:
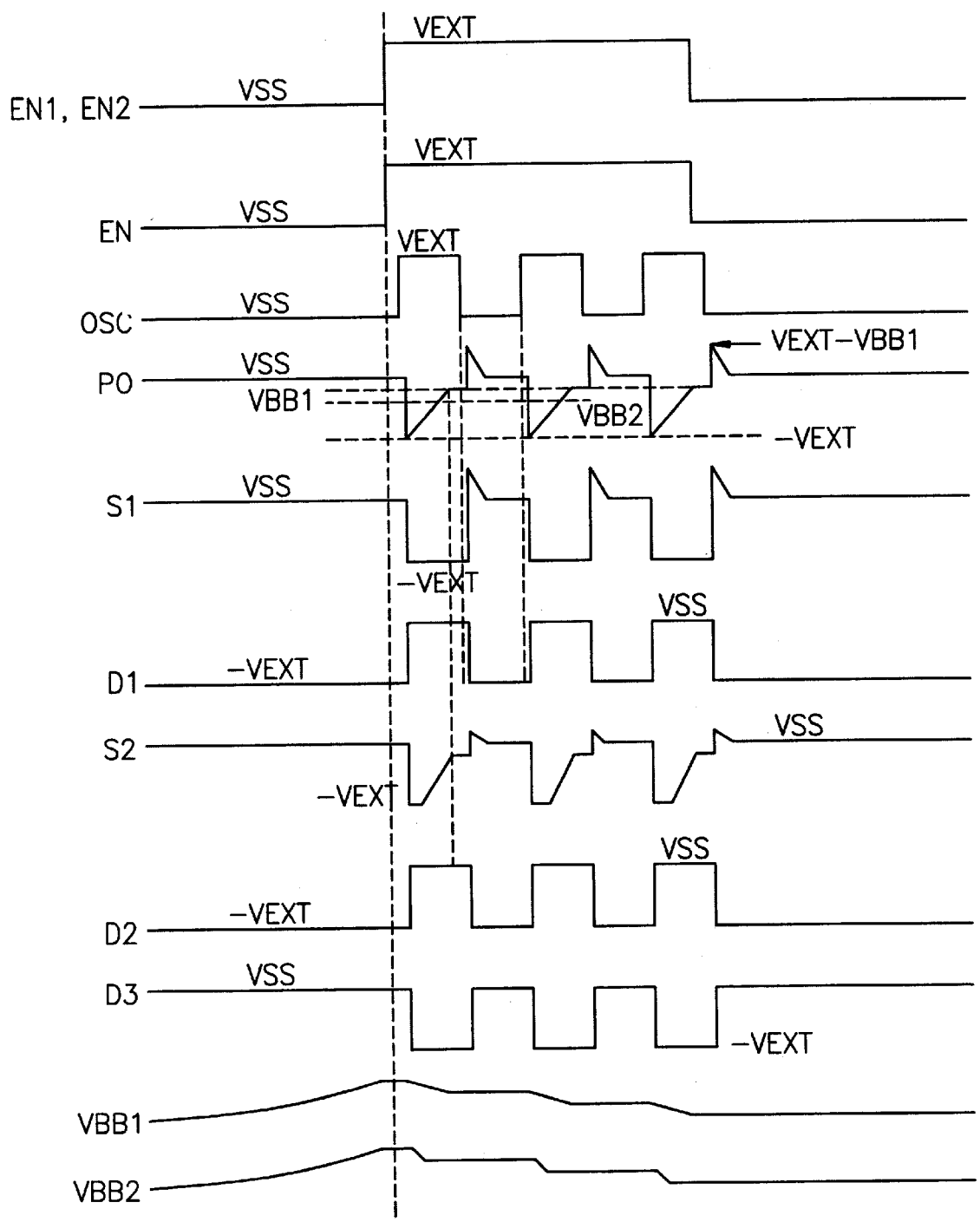
FIG. 9 is a timing diagram showing signals relative to each other when both a first and a second detector of the circuit of FIG. 4 or FIG. 5 or FIG. 6 are enabled, according to a preferred embodiment of the invention.

Referring now to FIG. 9, a timing diagram is shown to describe signals relative to each other when both first detector 650 and second detector 660 of the circuit of FIG. 6 are enabled. That happens when both voltages VBB1 and VBB2 are not at their target values. Again, the fact that signals EN1 and EN2 being "high" enables output signal EN of oscillator control circuit 670 to be "high".

As will be appreciated, second voltage VBB2 is output concurrently with outputting first voltage VBB1. In this case, both switching circuits 630, 640 operate at the same time. Moreover, first transfer transistor 631 and second transfer transistor 641 are adapted to be turned on and off in phase with each other.

More particularly, first switching circuit 630 and first switching control circuit 680 operate as was described in FIG. 7. In second switching circuit 640, voltage—VEXT is applied alternatingly to gate D2 of transistor 642 and gate D3 of transistor 643 via second switching control circuit 690, so that pumping node PO becomes connected to gate S2 of transfer transistor 641. As a result, the voltage at gate S2 of transfer transistor 641 is maintained equal to the voltage at pumping node PO. Transfer transistor 641 becomes configured as a diode between pumping node PO and VBB2 node. Thus, the negative charges at the pumping node PO are transmitted to second component 605. Accordingly, the negative charges of VBB2 node do not flow back to pumping node PO. Thus, there is no problem, even if charge pumping for the voltages VBB1 and VBB2 occurs simultaneously.

Figure 10:
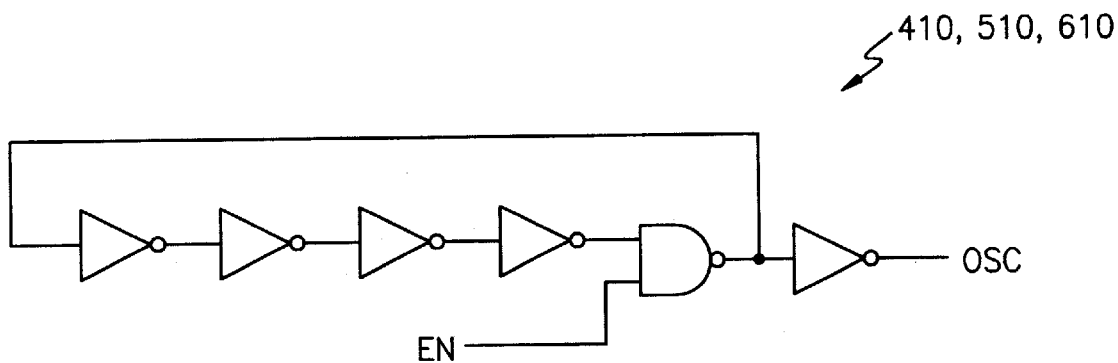
FIG. 10 is a more detailed diagram of an oscillator of the circuit of FIG. 4 or FIG. 5 or FIG. 6, according to a preferred embodiment of the invention.

FIG. 10 is a more detailed diagram of an oscillator of the circuit of FIG. 4 or FIG. 5 or FIG. 6, according to a preferred embodiment of the invention. The embodiment of FIG. 10 is implemented with a series of inverters and an NAND gate.

Oscillator 410 (or 510 or 610) operates if an input signal EN is enabled to "high" through the NAND gate. That would be if either first detection signal EN1 or second detection signal EN2 are high. However, if both detection signals EN1, EN2 are low, the oscillator does not operate. The above operation is repeated according to the input signal EN as required.

Figure 11:
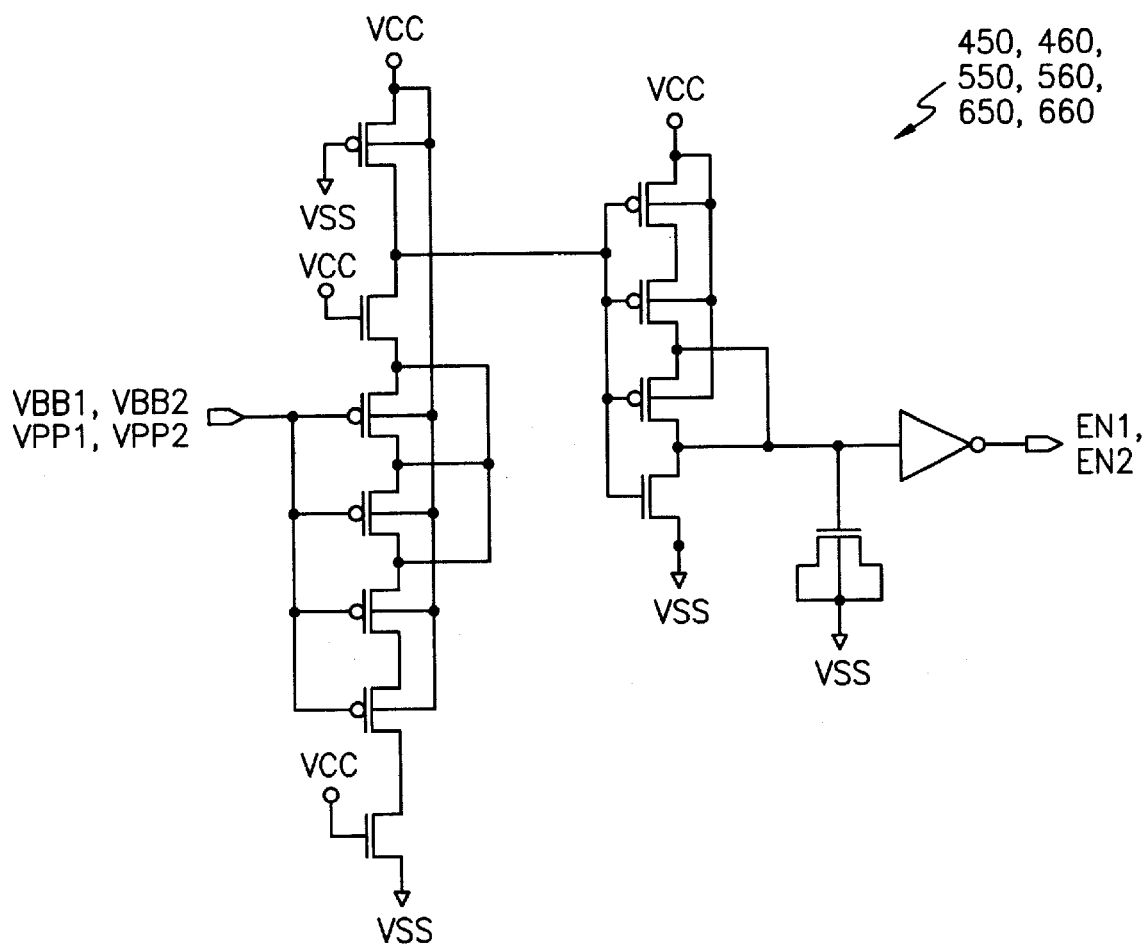
FIG. 11 is a more detailed diagram of a voltage detector of the circuit of FIG. 4 or FIG. 5 or FIG. 6, according to a preferred embodiment of the invention.

FIG. 11 is a more detailed diagram of either one of the first and second voltage detectors of the circuit of FIG. 4 or FIG. 5 or FIG. 6, according to a preferred embodiment of the invention. In each case, the voltage detector may be made from a group of PMOS and NMOS transistors. There are a number of diverse ways to implement the desired logic of the detector, for receiving a voltage VBB1 (or VBB2 or VPP1 or VPP2), and outputting a detection signal EN1 (or EN2). In this case, detection signal EN1 is enabled to "high" if the level of the voltage VBB1 is outside the appropriate range for the voltage value. In this case, preset values for comparing VBB1 are designed by the arrangement of the PMOS and NMOS transistors.

Figure 12:
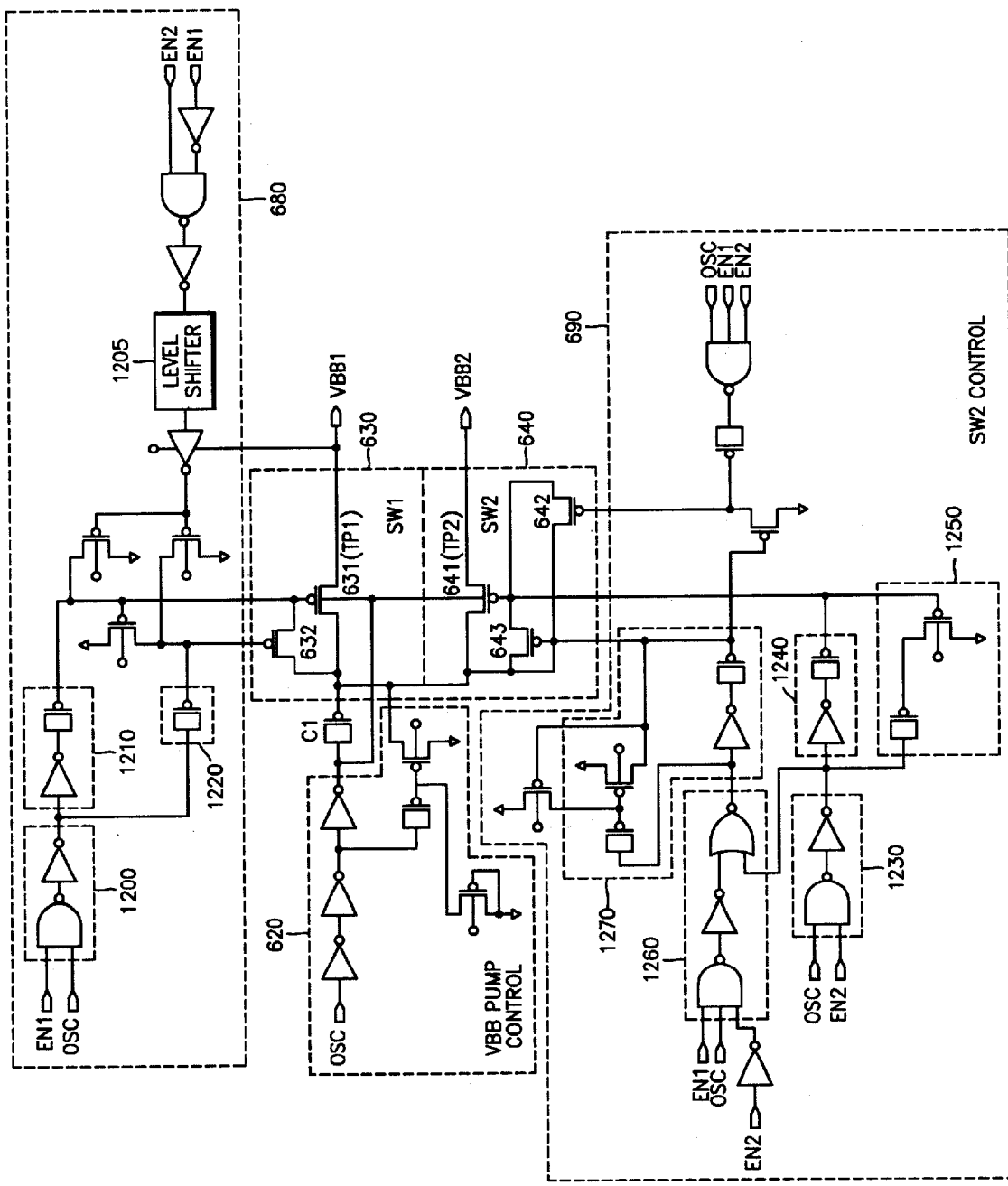
FIG. 12 is a more detailed circuit diagram of components of the embodiment of FIG. 4 or FIG. 5 or FIG. 6, according to a preferred embodiment of the invention.

FIG. 12 is a more detailed circuit diagram of components of the embodiment of FIG. 4 or FIG. 5 or FIG. 6, according to a preferred embodiment of the invention. More specifically, FIG. 12 is a detailed circuit diagram of charge pump control circuit 620, pumping capacitor C1, and the first and second switching control circuits 680, 690.

Charge pump control circuit 620 receives oscillating signal OSC and performs charge pumping at pumping node PO through pumping capacitor C1. Charge pump control circuit 620 is made from plurality of transistors, whose output signal is applied to pumping capacitor C1. Pumping node PO operates as shown in the timing diagrams of FIGS. 7, 8, and 9.

Further, first switching control circuit 680 consists of a first logic circuit portion 1200 for receiving detection signal EN1 and oscillating signal OSC. Reception may also be performed through a level shifter 1205. Circuit 680 also includes a first pumping portion 1210 for receiving an output signal of first logic circuit portion 1200 to perform charge pumping, and a second pumping portion 1220 for receiving the output signal of first logic circuit portion 1200, to perform charge pumping. An output terminal of first pumping portion 1210 is connected to the gate of first transfer transistor TP1 631 of first switching circuit 630. An output terminal of second pumping portion 1220 is connected to the gate of control transistor 632. An oscillating signal of the output terminal of second pumping portion 1220 is received, and then transistor 632 is turned on. Thus, negative charges of the output node PO are transmitted to a final output terminal through first transfer transistor 631. As seen above, the charge pumping operation is performed until the voltage VBB1 is brought to an appropriated value, and then halted.

Second switching control circuit 690 also consists of a second logic circuit portion 1230 for receiving detection signal EN2 and oscillating signal OSC. Circuit 690 also includes a third pumping portion 1240 for receiving an output signal of second logic circuit portion 1230 to perform charge pumping, a fourth pumping portion 1250 for receiving the output signal of second logic circuit portion 1230 to perform charge pumping, a third logic circuit portion 1260 for receiving detection signal EN1 and the output signal of second logic circuit portion 1230, and a fifth pumping portion 1270 for receiving the output signal of third logic circuit portion 1260 to perform charge pumping.

An oscillating signal of the output terminal of the third pumping portion 1240 is received, and transfer transistor TP2 641 is turned on. The negative charges at pumping node PO are thus transmitted to a final output terminal VBB2. Further, detection signal EN1 is applied to second switching control circuit 690. Thus, when both the detection signal EN1 and the detection signal EN2 are enabled to 'high' level, control transistor 642 is turned on. This prevents the negative charges of the output terminal of voltage VBB2 from flowing back to pumping node PO. Also, when the detection signals EN1 is disabled while the detection signal EN2 is enabled, both control transistor 642 and control transistor 643 are turned off, and thus transfer transistor 641 is also turned on. The negative charges at pumping node PO are thus transmitted to the node of the voltage VBB2. However, when the detection signal EN1 is enabled while the detection signal EN2 is disabled, in situation of 'low' level of OSC signal, control transistor 643 is turned on. This prevents the negative charges of the output terminal of voltage VBB2 from flowing back to pumping node PO.

The operation is performed until the voltage VBB2 is brought at an appropriate value. That is, when the value of the voltage VBB2 reaches the appropriate value, detection signal EN2 is disabled, and thus transistors 641, 642 are turned off. However, if the level of the voltage VBB2 deviates from the appropriate value again, the operation is repeated, so as to maintain an appropriate value of the voltage VBB2.

Figure 13:
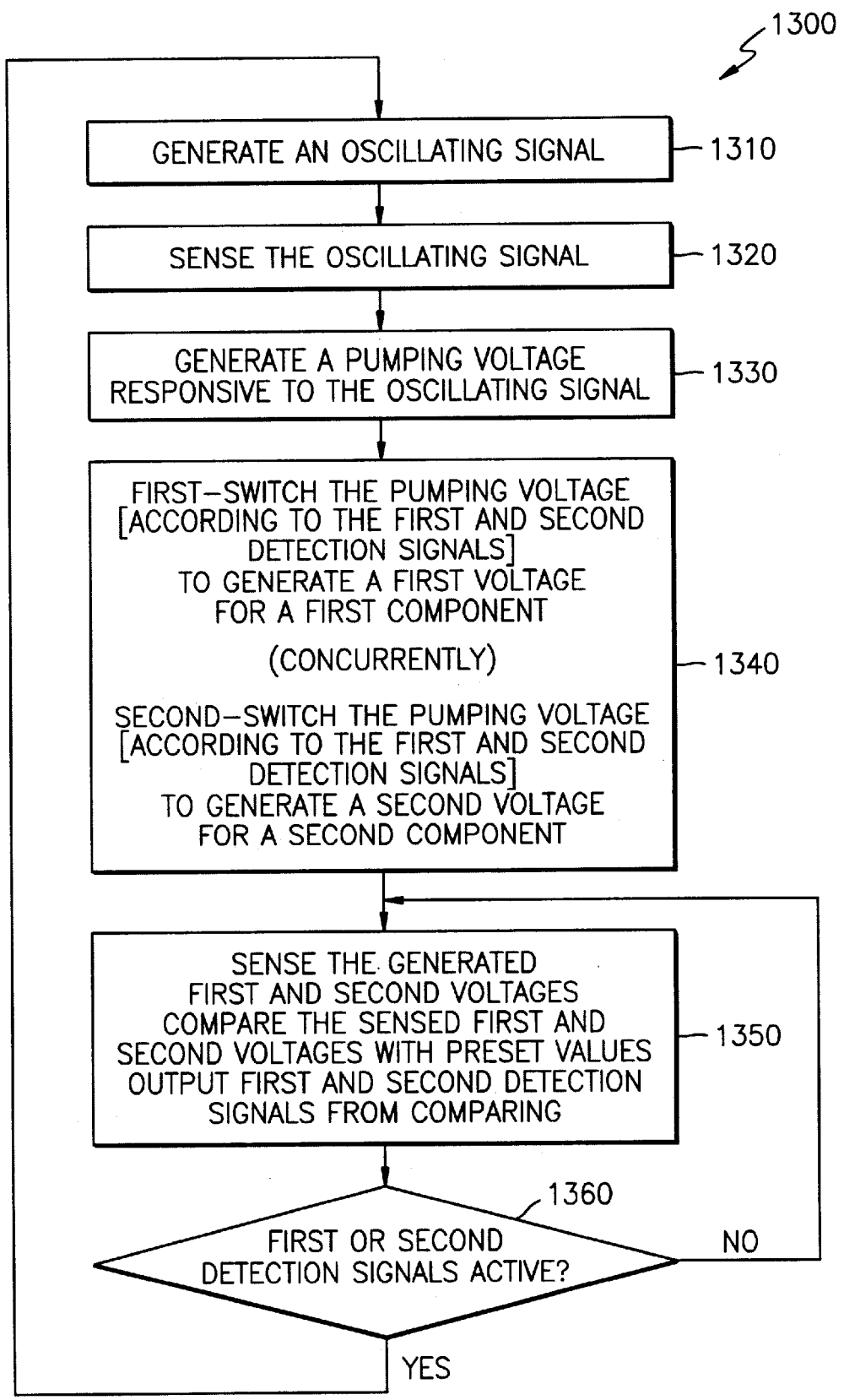
FIG. 13 is a flowchart illustrating a method according to an embodiment of the present invention.

Referring now to FIG. 13, a flowchart 1300 is used to illustrate a method according to an embodiment of the invention. As will be appreciated, once flowchart 1300 starts, it may continue indefinitely as a loop. The method of flowchart 1300 may also be practiced by devices 400, 500 and 600.

According to a box 1310, an oscillating signal is generated.

According to a next box 1320, the oscillating signal is sensed.

According to a next box 1330, a pumping voltage is generated responsive to the oscillating signal According to a next box 1340, the pumping voltage is first-switched to generate a first voltage for a first component. In addition, the pumping voltage is second-switched to generate a second voltage for a second component. Preferably this is performed concurrently with generating the first voltage.

Optionally and preferably, first switching and second switching is performed as controlled by detection signals. Their generation will become more clear from the below.

According to a next box 1350, the generated first and second voltages are sensed, and compared with preset values. First and second detection signals are output from comparing.

According to a next box 1360, it is inquired whether the first or second detection signals are active. In the above described embodiments, "active" was implemented by a "high" level of signals EN1, EN2, but that implementation is not the only option.

If not, it means that the first and second output voltages are within a desirable range, or at a desirable value. Execution returns to box 1350.

If yes, generation of the oscillating signal of box 1310 is controlled according to the first and second detection signals. In the preferred embodiment, this is implemented by simply returning to box 1310, to activate the oscillator, and reactivate it had it been idle.

A person skilled in the art will be able to practice the present invention in view of the description present in this document, which is to be taken as a whole. Numerous details have been set forth in order to provide a more thorough understanding of the invention. In other instances, well-known features have not been described in detail in order not to obscure unnecessarily the invention.

Furthermore, in the present document, a single item may be variously labeled "first" or "second" or with another such numeric identifier, depending on the immediate context or sub-context. Such is done for convenience in the description, without necessarily implying that if there is, say a "second" of something, there is also necessarily a "first".

While the invention has been disclosed in its preferred form, the specific embodiments as disclosed and illustrated herein are not to be considered in a limiting sense. Indeed, it should be readily apparent to those skilled in the art in view of the present description that the invention may be modified in numerous ways. The inventor regards the subject matter of the invention to include all combinations and subcombinations of the various elements, features, functions and/or properties disclosed herein.

The following claims define certain combinations and subcombinations, which are regarded as novel and non-obvious. Additional claims for other combinations and subcombinations of features, functions, elements and/or properties may be presented in this or a related document.

The invention claimed is:

1. A semiconductor memory device comprising:
   a first component;
   a second component;
   an oscillator to generate an oscillating signal;
   a charge pump that includes a pumping capacitor to generate, responsive to the oscillating signal, a pumping voltage at a pumping node;
   a first switching circuit coupled to the pumping node to output a first voltage to the first component from the pumping voltage; and
   a second switching circuit coupled to the pumping node to output a second voltage to the second component from the pumping voltage.

2. The device of claim 1, in which
   the second voltage is output concurrently with outputting the first voltage.

3. The device of claim 1, in which
   the first voltage equals the second voltage.

4. The device of claim 1, in which
   the first voltage is negative, and also higher than the second voltage.

5. The device of claim 1, in which
   the first switching circuit operates when the second switching circuit operates, and also when the second switching circuit does not operate.

6. The device of claim 1, in which
   the first voltage is a boosting voltage over a supply voltage, and also higher than the second voltage.

7. The device of claim 1, in which
   the first switching circuit includes a first transfer transistor coupled between the pumping node and the first component.

8. The device of claim 7, in which
   the first transfer transistor is adapted to be alternatingly turned on and off with a period similar to that of the oscillating signal.

9. The device of claim 7, in which
   the second switching circuit includes a second transfer transistor coupled between the pumping node and the second component.

10. The device of claim 9, in which
    the first transfer transistor and the second transfer transistor are adapted to be turned on and off in phase with each other.

11. The device of claim 7, in which
    the first switching circuit further includes a first control transistor coupled between the pumping node and a gate of the first transfer transistor.

12. The device of claim 11, in which
    the first transfer transistor operates with a phase opposite from that of the first control transistor.

13. The device of claim 11, in which the first switching circuit further includes
    a second control transistor coupled between the pumping node and the gate of the first transfer transistor.

14. The device of claim 1, further comprising:
    a first control unit to control the first switching circuit responsive to the oscillating signal.

15. The device of claim 14, further comprising:
    a first voltage detector to output a first detection signal in response to the generated first voltage,
    and in which the first control unit receives the first detection signal.

16. The device of claim 15, further comprising:
    an oscillator control circuit for selectively controlling the oscillator responsive to the first detection signal.

17. The device of claim 15, further comprising:
    a second voltage detector to output a second detection signal in response to the generated second voltage,
    and in which the first control unit further receives the second detection signal.

18. The device of claim 17, further comprising:
    an oscillator control circuit for selectively controlling the oscillator responsive to the first detection signal and the second detection signal.

19. A semiconductor memory device comprising:
    a wordline driver circuit;
    at least one of a bit line sense amplifier block control circuit and a substrate of a memory cell transistor;
    an oscillator to generate an oscillating signal;
    a charge pump that includes a pumping capacitor to generate, responsive to the oscillating signal, a pumping voltage at a pumping node;
    a first switching circuit coupled to the pumping node to output from the pumping voltage a first voltage to the wordline driver circuit; and
    a second switching circuit coupled to the pumping node to output from the pumping voltage a second voltage to the one of the bit line sense amplifier block control circuit and the substrate of the memory cell transistor.

20. The circuit of claim 19, in which
the first switching circuit operates when the second switching circuit operates, and also when the second switching circuit does not operate.

21. The circuit of claim 19, further comprising:
a first control unit to control the first switching circuit responsive to the oscillating signal; and
a second control unit to control the second switching circuit responsive to the oscillating signal.

22. The circuit of claim 21, further comprising:
a first voltage detector to output a first detection signal in response to the generated first voltage; and
a second voltage detector to output a second detection signal in response to the generated second voltage,
and in which the first control unit receives the first detection signal and the second detection signal.

23. The circuit of claim 22, further comprising:
an oscillator control circuit for selectively controlling the oscillator responsive to the first detection signal and to the second detection signal.

24. A semiconductor device comprising:
means for generating an oscillating signal;
means for generating a pumping voltage responsive to the oscillating signal;
means for first-switching the pumping voltage to generate a first voltage for a first component; and
means for second-switching the pumping voltage to generate a second voltage for a second component concurrently with generating the first voltage.

25. The device of claim 24, further comprising:
means for further sensing the generated first and second voltages;
means for comparing the sensed first and second voltages with preset values;
means for outputting respective first and second detection signals in accordance with comparing; and
means for controlling a generation of the oscillating signal in accordance with the detection signals.

26. The device of claim 24, in which
first-switching is performed by switching a first transfer transistor alternatingly on and off with a period derived from a period of the oscillating signal.

27. The device of claim 26, further comprising:
means for further sensing the generated first and second voltages;
means for comparing the sensed first and second voltages with preset values;
means for outputting respective first and second detection signals in accordance with comparing; and
means for further controlling switching the first transfer transistor in accordance with the detection signals.

28. The device of claim 26, in which
second-switching is performed by switching a second transfer transistor alternatingly on and off with a period derived from a period of the oscillating signal.

29. The device of claim 28, in which
the first and second transfer transistors are turned on and off in phase.

30. The device of claim 28, further comprising:
means for further sensing the generated first and second voltages;
means for comparing the sensed first and second voltages with preset values;
means for outputting respective first and second detection signals in accordance with comparing; and
means for further controlling switching the first and second transfer transistors in accordance with the detection signals.

31. A method comprising:
generating an oscillating signal;
generating a pumping voltage responsive to the oscillating signal;
first-switching the pumping voltage to generate a first voltage for a first component; and
second-switching the pumping voltage to generate a second voltage for a second component concurrently with generating the first voltage.

32. The method of claim 31, further comprising:
further sensing the generated first and second voltages;
comparing the sensed first and second voltages with preset values;
outputting respective first and second detection signals in accordance with comparing; and
controlling a generation of the oscillating signal in accordance with the detection signals.

33. The method of claim 31, in which
first-switching is performed by switching a first transfer transistor alternatingly on and off with a period derived from a period of the oscillating signal.

34. The method of claim 33, further comprising:
further sensing the generated first and second voltages;
comparing the sensed first and second voltages with preset values;
outputting respective first and second detection signals in accordance with comparing; and
further controlling switching the first transfer transistor in accordance with the detection signals.

35. The method of claim 33, in which
second-switching is performed by switching a second transfer transistor alternatingly on and off with a period derived from a period of the oscillating signal.

36. The method of claim 35, in which
the first and second transfer transistors are turned on and off in phase.

37. The method of claim 35, further comprising:
further sensing the generated first and second voltages;
comparing the sensed first and second voltages with preset values;
outputting respective first and second detection signals in accordance with comparing; and
further controlling switching the first and second transfer transistors in accordance with the detection signals.

* * * * *